(12) United States Patent
Doi et al.

(10) Patent No.: US 12,479,139 B2
(45) Date of Patent: Nov. 25, 2025

(54) DISPLAY DEVICE, MANUFACTURING METHOD THEREOF, AND INSTRUMENT PANEL COMPRISING DISPLAY DEVICE

(71) Applicant: NIFCO INC., Yokosuka (JP)

(72) Inventors: Atsushi Doi, Yokosuka (JP); Tsuyoshi Fukuda, Yokosuka (JP); Keisuke Fukushima, Yokosuka (JP); Eiichiro Nishio, Yokosuka (JP)

(73) Assignee: NIFCO INC., Yokosuka (JP)

( * ) Notice: Subject to any disclaimer, the term of this patent is extended or adjusted under 35 U.S.C. 154(b) by 733 days.

(21) Appl. No.: 17/454,834

(22) Filed: Nov. 15, 2021

(65) Prior Publication Data

US 2022/0078936 A1   Mar. 10, 2022

Related U.S. Application Data

(63) Continuation of application No. PCT/JP2020/021335, filed on May 29, 2020.

(30) Foreign Application Priority Data

Jun. 7, 2019 (JP) .................................. 2019-107314

(51) Int. Cl.
  B60K 35/22 (2024.01)
  B29C 45/14 (2006.01)
  (Continued)

(52) U.S. Cl.
  CPC .............. B29C 45/14 (2013.01); B60K 35/22 (2024.01); B60K 35/60 (2024.01); B60K 37/20 (2024.01);
  (Continued)

(58) Field of Classification Search
  CPC ........ H05K 5/03; H05K 5/0017; B29C 45/15; B29K 2075/00; B29K 2995/0026; B29L 2031/3475; B60K 35/22
  (Continued)

(56) References Cited

U.S. PATENT DOCUMENTS

2005/0163940 A1* 7/2005 Liang ................... H04M 1/0283
                                                                                        264/255
2015/0237756 A1* 8/2015 Lim .................. B29C 45/14467
                                                                                        264/261
(Continued)

FOREIGN PATENT DOCUMENTS

JP    2007-535416 A    12/2007
JP    2010-217770 A     9/2010
(Continued)

OTHER PUBLICATIONS

International Search Report issued Aug. 11, 2020 in PCT/JP2020/021335 filed on May 29, 2020, 3 pages.
(Continued)

Primary Examiner — Ruiyun Zhang
(74) Attorney, Agent, or Firm — Oblon, McClelland, Maier & Neustadt, L.L.P.

(57) ABSTRACT

The display device includes a display, a resin member, and a transparent layer. The display includes a first surface on which an image is displayed, a second surface located oppositely to the first surface, and a side surface extending from the first surface to reach the second surface. The resin member includes an inner wall surface at least partially opposed to the side surface of the display, a first surface connected to the inner wall surface and located on the same side as the first surface of the display, and a second surface connected to the inner wall surface and located on the same side as the second surface of the display. The transparent layer includes a second surface spreading in contact with the
(Continued)

first surface of the display and the first surface of the resin member, and a first surface located oppositely to the second surface.

6 Claims, 9 Drawing Sheets

(51) Int. Cl.
  *B60K 35/60* (2024.01)
  *B60K 37/20* (2024.01)
  *H05K 5/03* (2006.01)
  *B29K 75/00* (2006.01)
  *B29L 31/34* (2006.01)
(52) U.S. Cl.
  CPC ............ *H05K 5/03* (2013.01); *B29K 2075/00* (2013.01); *B29K 2995/0026* (2013.01); *B29L 2031/3475* (2013.01)
(58) Field of Classification Search
  USPC ........................................................ 428/1.1
  See application file for complete search history.

(56) References Cited

U.S. PATENT DOCUMENTS

| 2016/0182695 | A1* | 6/2016 | Kim ..................... H04M 1/22 |
| | | | 455/575.4 |
| 2017/0235100 | A1 | 8/2017 | Huang et al. |
| 2019/0202173 | A1* | 7/2019 | Fukatani ................. B32B 27/08 |

FOREIGN PATENT DOCUMENTS

| JP | 2016-109728 A | 6/2016 |
| WO | WO 2017/094617 A1 | 6/2017 |
| WO | WO 2018/135495 A1 | 7/2018 |

OTHER PUBLICATIONS

International Preliminary Report on Patentability and Written Opinion issued Dec. 16, 2021 in PCT/JP2020/021335, 7 pages.
German Office Action issued Oct. 21, 2022 in German Patent Application No. 112020002729.5, 8 pages.
Office Action dated Nov. 22, 2024 issued in corresponding German patent application No. 11 2020 002 729.5 (with English translation).

* cited by examiner

DISPLAY DEVICE, MANUFACTURING METHOD THEREOF, AND INSTRUMENT PANEL COMPRISING DISPLAY DEVICE

CROSS-REFERENCE TO RELATED APPLICATIONS

This application is based upon and claims the benefit of priority from Japanese Patent Application No. 2019-107314, filed on Jun. 7, 2019; the entire contents of which are incorporated herein by reference.

BACKGROUND OF THE INVENTION

Field of the Invention

The present invention relates to a display device comprising a display and a resin member.

Background Art

A display device in which a display and a resin member are combined is known. For example, Patent Document 1 proposes that a display is provided by in-molding on a resin member having a curved surface.

Patent Document 1: JP2007-535416A

SUMMARY OF THE INVENTION

When the display is provided by in-molding on the curved surface of the resin member, the display must be flexible, which restricts the choice of the display. In addition, an adhesive layer for adhering the display onto the resin member is required, which increases a manufacturing cost of the display device. Moreover, when a protective layer is formed on a surface of the display, a process of coating the surface of the display with a film is required after the display and the resin member have been removed from a die, which also increases the manufacturing cost.

The object of the present invention is to provide a display device and a manufacturing method thereof which can effectively solve such problems.

The present invention is a display device comprising:
  a display including a first surface on which an image is displayed, a second surface located oppositely to the first surface, and a side surface extending from the first surface to reach the second surface;
  a resin member including an inner wall surface at least partially opposed to the side surface of the display, a first surface connected to the inner wall surface and located on the same side as the first surface of the display, and a second surface connected to the inner wall surface and located on the same side as the second surface of the display; and
  a transparent layer including a second surface spreading in contact with the first surface of the display and the first surface of the resin member, and a first surface located oppositely to the second surface.

In the display device according to the present invention, the transparent layer may contain a polyurethane or a polyurea.

In the display device according to the present invention, the first surface of the transparent layer may include a part overlapping the first surface of the display and having a shape different from the first surface of the display.

In the display device according to the present invention, the first surface of the display may have a flat shape, and the part of the first surface of the transparent layer, which part overlaps the first surface of the display, may have a curved shape that is convex in a direction from the second surface toward the first surface.

In the display device according to the present invention, the transparent layer may include a filling portion located between the side surface of the display and the inner wall surface of the resin member.

The display device according to the present invention may comprise a frame including a first portion located between the side surface of the display and the inner wall surface of the resin member, and a second portion connected to the first portion and located between the first surface of the display and the first surface of the transparent layer.

The present invention is an instrument panel comprising:
  a body part having a surface and an opening; and
  the aforementioned display device located in the opening of the body part;
  wherein the surface of the body part and the first surface of the transparent layer of the display device spread continuously.

The present invention is a manufacturing method of a display device comprising:
  a step of arranging a display between a pair of first dies, the display including a first surface on which an image is displayed, a second surface located oppositely to the first surface, and a side surface extending from the first surface to reach the second surface;
  a first forming step of forming a resin member by supplying a resin between the pair of first dies at a first pressure, the resin member including an inner wall surface at least partially opposed to the side surface of the display, a first surface connected to the inner wall surface and located on the same side as the first surface of the display, and a second surface connected to the inner wall surface and located on the same side as the second surface of the display; and
  a second forming step of forming a transparent layer by supplying a transparent material to the first surface of the display and the first surface of the resin member at a second pressure lower than the first pressure, the transparent layer including a second surface spreading in contact with the first surface of the display and the first surface of the resin member, and a first surface located oppositely to the second surface.

In the manufacturing method of a display device according to the present invention, the second forming step may include a step of arranging the display and the resin member between a pair of second dies, and a step of obtaining the transparent layer by supplying the transparent material containing an isocyanate compound and a polyol or a polyamine between the pair of second dies to react the isocyanate compound and the polyol or the polyamine between the pair of second dies.

In the manufacturing method of a display device according to the present invention, one of the pair of first dies used in the first forming step may be used as one of the pair of second dies used in the second forming step.

The present invention can provide a display device having an optional surface shape.

DETAILED DESCRIPTION OF THE INVENTION

Figure 1:
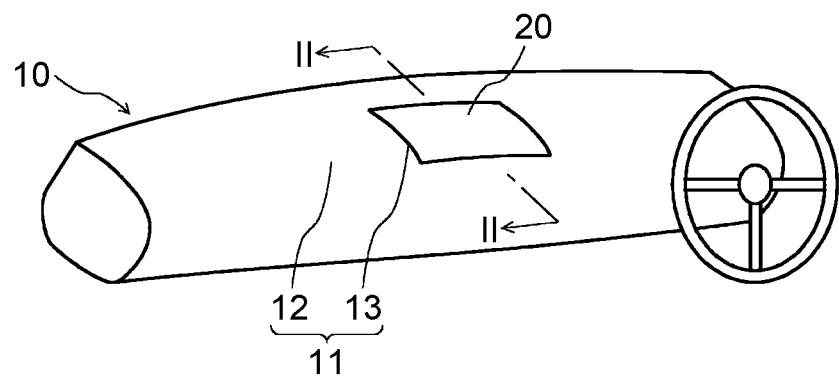
FIG. 1 is a perspective view showing an instrument panel comprising a display device in an embodiment of the present invention.

An embodiment of the present invention is described herebelow with reference to the drawings. In the drawings attached to the specification, a scale dimension, an aspect ratio and so on are changed and exaggerated from the actual ones, for the convenience of easiness in understanding.
(Instrument Panel)

FIG. 1 is a perspective view showing an instrument panel 10 of a motor vehicle. The instrument panel 10 comprises: a body part 11 having a surface 12 and an opening 13; and a display device 20 located in the opening 13 of the body part 11.

The body part 11 is a member containing a resin. Examples of the resin of the body part 11 may include a thermoplastic resin such as a PC resin (polycarbonate resin), an ABS resin (acrylonitrile-butadiene-styrene copolymerization synthetic resin), and a mixed resin of the PC resin and the ABS resin. The body part 11 is produced by an injection molding method, for example.

The surface 12 of the body part 11 may have a curved shape, as shown in FIG. 1. Alternatively, although not shown, the surface may have a flat shape. In addition, the surface 12 may have an uneven pattern such as embossing or pearskin. Moreover, the surface 12 may be provided with a protective layer or coating. The opening 13 of the body part 11 is formed in the surface 12 to penetrate the body part 11.

The display device 20 is preferably seen to have a surface continuous to the surface 12 of the body part 11. For example, when the surface 12 of the body part 11 has a curved shape, the surface of the display device 20 preferably has a curved shape to be continuous to the surface 12 of the body part 11. Thus, the design of the instrument panel 10 can be improved. The display device 20 is described below.
(Display Device)

Figure 2:
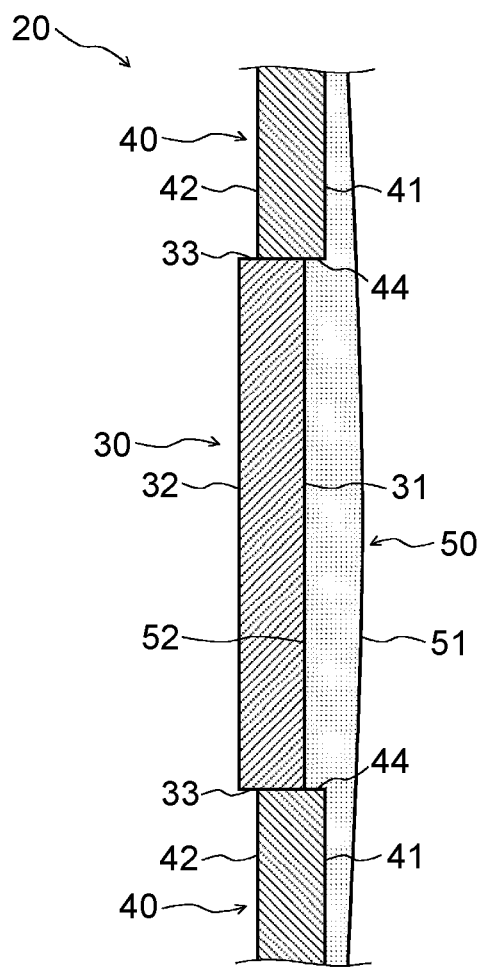
FIG. 2 is a cross-sectional view showing the display device shown in FIG. 1 when viewed in a II-II direction.

FIG. 2 is a cross-sectional view showing the display device 20 shown in FIG. 1 when viewed in a II-II direction. The display device 20 comprises a display 30, a resin member 40, and a transparent layer 50.

The display 30 is a component capable of displaying an image. Examples of the display 30 may include a liquid crystal display, an organic EL display, a micro LED display, a quantum dot display, and the like.

The display 30 includes a first surface 31 on which an image is displayed, a second surface 32 located oppositely to the first surface 31, and a side surface 33 extending from the first surface 31 to reach the second surface 32. The first surface 31 is located on the surface 12 side of the body part 11, and the second surface 32 is located oppositely to the surface 12 of the body part 11. In other words, a distance from the first surface 31 up to the surface 12 is shorter than a distance from the second surface 32 up to the surface 12. In the description below, the side of the surface 12 of the body part 11 is also referred to as outside or outer, and the opposite side of the surface 12 of the body part 11 is also referred to as inside or inner.

As shown in FIG. 2, the first surface 31 may have a flat shape. Alternatively, although not shown, the first surface 31 may have a curved shape.

The resin member 40 is a member that supports the display 30 from its side surface 33 side. The resin member 40 includes an inner wall surface 44, a first surface 41, and a second surface 42. The inner wall surface 44 is at least partially opposed to the side surface 33 of the display 30. In the example shown in FIG. 2, the inner wall surface 44 of the resin member 40 is in contact with a part of the side surface 33 of the display 30.

As shown in FIG. 2, the first surface 41 of the resin member 40 is located on the same side as the first surface 31 of the display 30, and the second surface 42 is located on the same side as the second surface 32 of the display 30. The first surface 41 and the second surface 42 are connected to the inner wall surface 44. Preferably, the first surface 41 and the second surface 42 of the resin member 40 do not overlap the first surface 31 and the second surface 32 of the display 30 in a thickness direction of the display device 20. Thus, the first surface 31 and the second surface 32 of the display 30 are exposed from the resin member 40.

As shown in FIG. 2, the first surface 41 of the resin member 40 may have a flat shape. Alternatively, although not shown, the first surface 41 may have a curved shape. In addition, the first surface 41 may have an uneven pattern such as embossing or pearskin. As shown in FIG. 2, the first surface 41 may be located outside the first surface 31 of the display 30. Similarly, the second surface 42 may be located outside the second surface 32 of the display 30.

Figure 3:
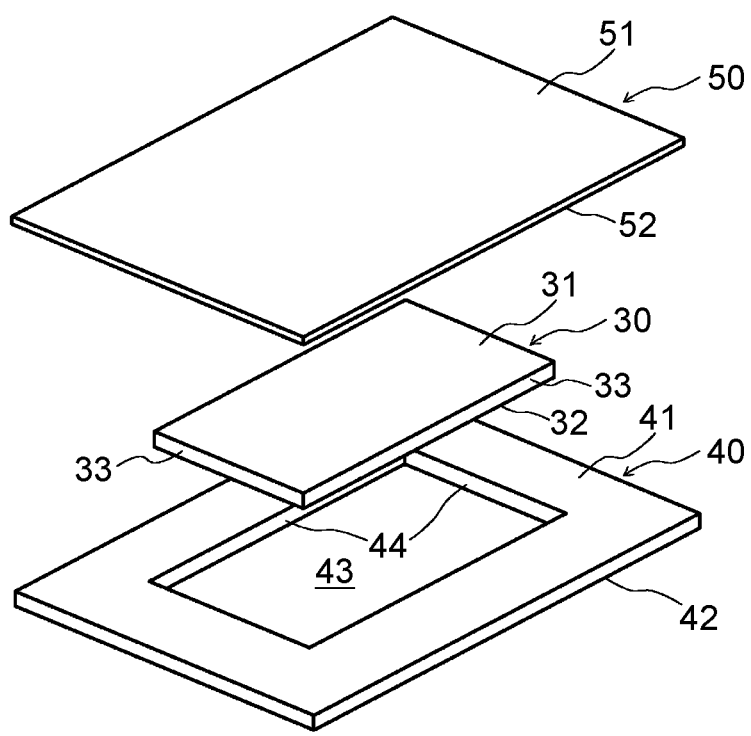
FIG. 3 is an exploded view of the display device.

FIG. 3 is a view showing an example of the display 30, the resin member 40 and the transparent layer 50 of the display device 20, which are virtually disassembled. As shown in FIG. 3, the resin member 40 may be a frame-shaped member having an opening 43 in which the display 30 is fitted. In this case, the inner wall surface 44 of the resin member 40 defines an outline of the opening 43.

Similarly to the body part 11 of the instrument panel 10, examples of a resin of the resin member 40 may include a thermoplastic resin such as a PC resin, an ABS resin, and a mixed resin of the PC resin and the ABS resin. The resin member 40 may be formed integrally with the body part 11, or may be a member separate from the body part 11. A thickness of the resin member 40 is, for example, 0.5 mm or more and 20 mm or less.

The transparent layer 50 is a layer spreading over both the display 30 and the resin member 40. The transparent layer 50 includes a second surface 52 spreading in contact with the first surface 31 of the display 30 and the first surface 41 of the resin member 40, and a first surface 51 located oppositely to the second surface 52. In the example shown in FIG. 2, the first surface 51 of the transparent layer 50 forms an outside surface of the display device 20.

The transparent layer 50 is configured so that an image from the display 30 is visible through the transparent layer 50. A total light transmittance of a part of the transparent layer 50, which overlaps the display 30, is 60% or more, for example. The total light transmittance may be measured by a measuring instrument in accordance with JIS K 7361-1. A thickness of the transparent layer 50 may be 2 mm or less. The thickness of the transparent layer 50 may be 0.1 mm or more.

As a transparent material forming the transparent layer 50, a two-component curable material may be used, for example. The two-component curable material is a cured product produced by a reaction between a first liquid forming a main agent and a second liquid forming a curing agent, and may be used as a paint, for example. Examples of the two-component curable material forming the transparent layer 50 may include a polyurethane and a polyurea. The polyurethane is a cured product produced by a reaction of a polyol as a main agent and an isocyanate compound as a curing agent. The polyurea is a cured product produced by a reaction of a polyamine as a main agent and an isocyanate compound as a curing agent.

A shape of the first surface 51 of the transparent layer 50 may be optionally determined according to the design required for the display device 20 and/or the instrument panel 10. Preferably, the first surface 51 of the transparent layer 50 spreads continuously to the surface 12 of the body part 11. "Continuously" means that a step between the surface 12 of the body part 11 and the first surface 51 of the transparent layer 50 is 1 mm or less.

A part of the first surface 51 of the transparent layer 50, which overlaps the first surface 31 of the display 30, may have a shape different from a shape of the first surface 31 of the display 30. In the example shown in FIG. 2, the first surface 31 of the display 30 has a flat shape, and a part of the first surface 51 of the transparent layer 50, which overlaps the first surface of the display 30, has a curved shape that is convex in a direction from the second surface 52 toward the first surface 51, i.e., toward the outside.

(Manufacturing Method of Display Device)

Next, a manufacturing method of the aforementioned display device 20 is described with reference to FIGS. 4 to 7.

Figure 4:
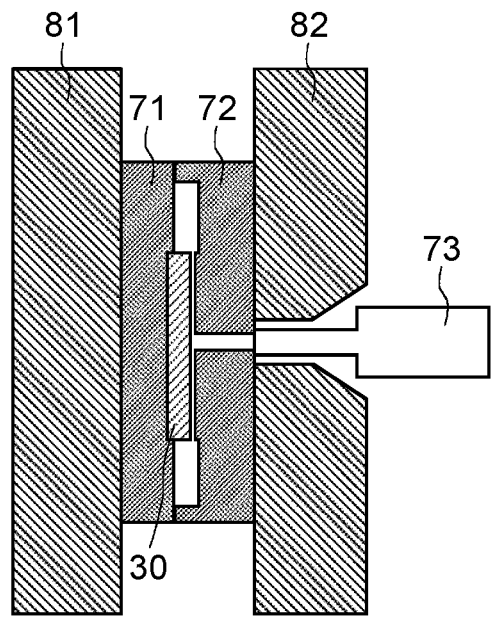
FIG. 4 is a view for explaining a step of forming a resin member.

Firstly, as shown in FIG. 4, a pair of first dies 71 and 72 are prepared. The pair of first dies 71 and 72 include, for example, a first movable die 71 installed on a first movable die plate 81, and a first stationary die 72 installed on a first stationary die plate 82. Following thereto, the display 30 is arranged between the pair of first dies 71 and 72, for example, on the first movable die 71 side.

Figure 5:
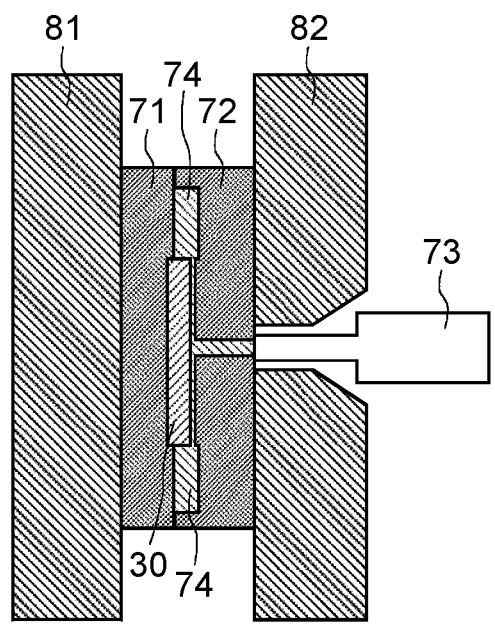
FIG. 5 is a view for explaining a step of forming the resin member.

Thereafter, as shown in FIG. 5, a first forming step of supplying a flowable high-temperature resin 74 between the pair of first dies 71 and 72 by means of a first supply unit 73 at a first pressure P1 is performed. Thus, the aforementioned resin member 40 can be formed on the side surface of the display 30.

Figure 6:
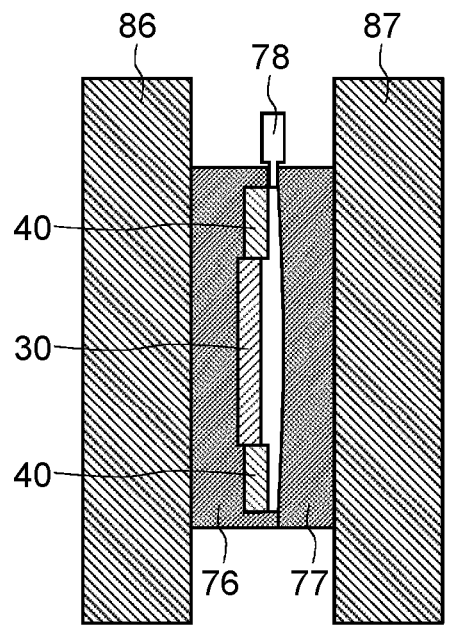
FIG. 6 is a view for explaining a step of forming a transparent layer.

Following thereto, a second forming step of forming the transparent layer 50 is performed. First, as shown in FIG. 6, a pair of second dies 76 and 77 are prepared. The pair of second dies 76 and 77 include, for example, a second movable die 76 installed on a second movable die plate 86, and a second stationary die 77 installed on a second stationary die plate 87. Following thereto, the display 30 and the resin member 40 are arranged between the pair of second dies 76 and 77, for example, on the second movable die 76 side.

The first movable die 71 and the first movable die plate 81 used in the first forming step may be used as the second movable die 76 and the second movable die plate 86 used in the second forming step. For example, after the resin member 40 has been formed between the pair of first dies 71 and 72, the first movable die plate 81 may be moved such that the first movable die 71 faces the second stationary die 77 as shown in FIG. 6. The first movable die 71 is located between the first stationary die 72 and the second stationary die 77. For example, the resin member 40 is firstly formed between the first movable die 71 and the first stationary die 72, with the first movable die 71 and the first movable die plate 81 being arranged such that the first movable die 71 faces the first stationary die 72. Thereafter, the first movable die plate 81 is rotated over 180° so that the first movable die 71 faces the second stationary die 77.

Figure 7:
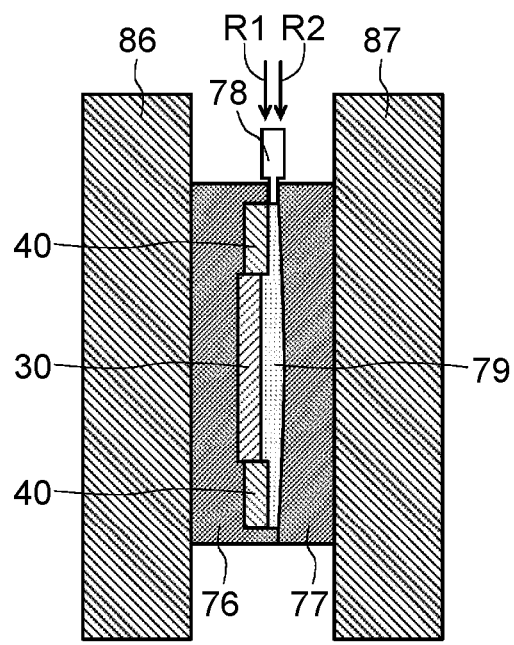
FIG. 7 is a view for explaining a step of forming the transparent layer.

Following thereto, as shown in FIG. 7, a flowable transparent material 79 is supplied between the pair of second dies 76 and 77 by means of a second supply unit 78 at a second pressure P2. The transparent material 79 is the aforementioned two-component curable material containing a polyol or a polyamine as a main agent R1, and an isocyanate compound as a curing agent R2. By reacting the main agent R1 and the curing agent R2 between the pair of second dies 76 and 77, the transparent layer 50 including the second surface 52 spreading in contact with the first surface 31 of the display 30 and the first surface 41 of the resin member 40 can be formed. The first surface 51 of the transparent layer 50 has an optional shape corresponding to the second stationary die 77.

The transparent material 79 containing the polyurethane, the polyurea, etc. has a higher flowability even at a low temperature than the PC resin or the ABS resin forming the resin member 40. Thus, the second pressure P2 at which the transparent material 79 is supplied between the pair of second dies 76 and 77 may be lower than the first pressure P1 at which the resin 74 is supplied between the pair of first dies 71 and 72. In addition, the transparent material 79 may be supplied between the pair of second dies 76 and 77 at an ordinary temperature, such as 30° C. or less.

According to this embodiment, since the transparent layer 50 can be integrally formed to spread over the first surface 31 of the display 30 and the first surface 41 of the resin member 40, a manufacturing cost of the display device 20 can be reduced. In addition, the transparent layer 50 can be in tight contact with the display 30 and the resin member 40 without providing an adhesive layer between the display 30 and the transparent layer 50 and between the resin member 40 and the transparent layer 50. This may also contribute to the reduction in manufacturing cost.

In addition, according to this embodiment, an optional shape corresponding to the second stationary die 77 can be given to the first surface 51 of the transparent layer 50 by reacting the main agent R1 and the curing agent R2 contained in the transparent material 79 to form the transparent layer 50. For example, a curved shape or the like, which is continuous to the surface 12 of the body part 11 of the instrument panel 10, can be given to the first surface 51. Thus, the surface of the display device 20, which is formed by the first surface 51 of the transparent layer 50, can be made as a design surface with a high degree of design freedom which is easily adjustable, regardless of the shape of the first surface 31 of the display 30. In addition, since a viscosity of the transparent material 79 containing the polyurethane or the polyurea is lower than that of the ABS resin or the PC resin forming the resin member 40, it is easy to give a refined shape corresponding to the second stationary die 77 to the first surface 51 of the transparent layer 50. Namely, the transparent material 79 has high transferability. This may also contribute to the improvement in design of the surface of the display device 20.

In addition, according to this embodiment, since the transparent layer 50 is in contact with the first surface 31 of the display 30, scattering of light between the transparent layer 50 and the first surface 31 of the display 30 can be suppressed as compared with a case in which there is a space between the transparent layer 50 and the first surface 31 of the display 30. This can improve visibility of an image.

In addition, according to this embodiment, the main agent R1 and the curing agent R2 to form the transparent layer 50 can be supplied between the pair of second dies 76 and 77 at the second pressure P2 lower than the first pressure P1 for the resin member 40. Thus, generation of residual stress in the transparent layer 50, which is caused by a high supply pressure, can be suppressed. This can suppress distortion of an image transmitted through the transparent layer 50 can be suppressed, which may also contribute to the improvement in visibility of an image.

In addition, according to this embodiment, the first movable die 71 and the first movable die plate 81 used in the first forming step can be used as the second movable die 76 and the second movable die plate 86 used in the second forming step. Thus, after the resin member 40 has been formed on the side surface of the display 30, the transparent layer 50 to be in contact with the display 30 and the resin member 40 can be formed, without removing the display 30 and the resin member 40 from the dies. This can simplify the manufacturing steps of the display device 20 and can reduce the manufacturing cost.

The aforementioned embodiment can be variously modified. Modification examples are described herebelow with reference to the drawings according to need. In the following description and in the drawings used in the following description, for portions that may be configured in the same manner as in the aforementioned embodiment, the same signs as those used for corresponding portions in the aforementioned embodiment are used, and redundant descriptions are omitted. In addition, an effect obtained in the aforementioned embodiment can be obviously obtained in the modification examples, description thereof may be omitted.

First Modification Example

Figure 8:
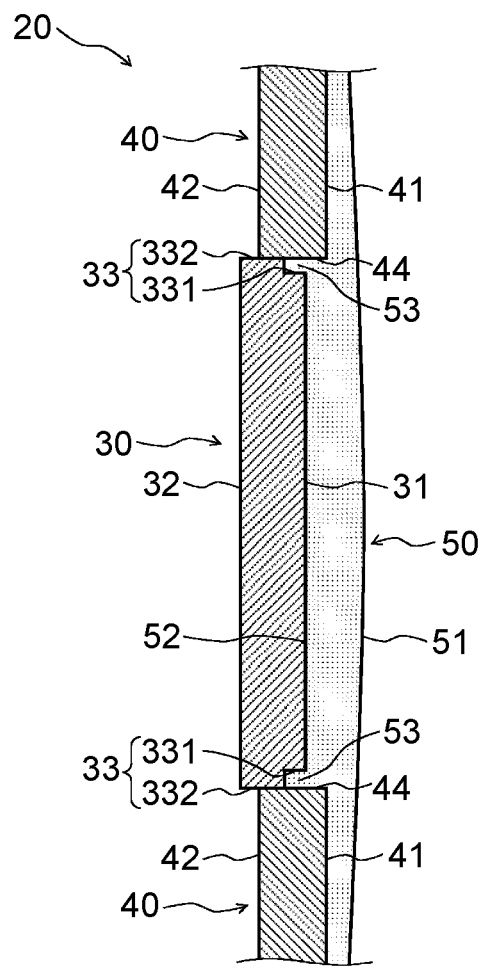
FIG. 8 is a cross-sectional view showing a modification example of the display device.

In the aforementioned embodiment, the side surface 33 of the display 30 and the inner wall surface 44 of the resin member 44 are in contact with each other. However, the present invention is not limited thereto. As shown in FIG. 8, a space may be partly present between the side surface 33 of the display 30 and the inner wall surface 44 of the resin member 44. For example, the side surface 33 of the display 30 may include a first side surface 331 opposed to the inner wall surface 44 and spaced therefrom, and a second side surface 332 in contact with the inner wall surface 44. The first side surface 331 is located nearer to a center of the display 30 than the second side surface 332. In the example shown in FIG. 8, the first side surface 331 is connected to the first surface 31, and the second side surface 332 is connected to the second surface 32. In this case, the transparent layer 50 may include a filling portion 53 located between the first side surface 331 of the side surface 33 of the display 30 and the inner wall surface 44 of the resin member 40.

Although not shown, the inner wall surface 44 of the resin member 40 may include a first inner wall surface opposed to the side surface 33 of the display 30 and spaced therefrom, and a second inner wall surface in contact with the side surface 33.

According to this modification example, since a space is formed between the side surface 33 of the display 30 and the inner wall surface 44 of the resin member 40, a contact area of the transparent layer 50 in contact with the display 30 and the resin member 40 can be increased.

Second Modification Example

Figure 9:
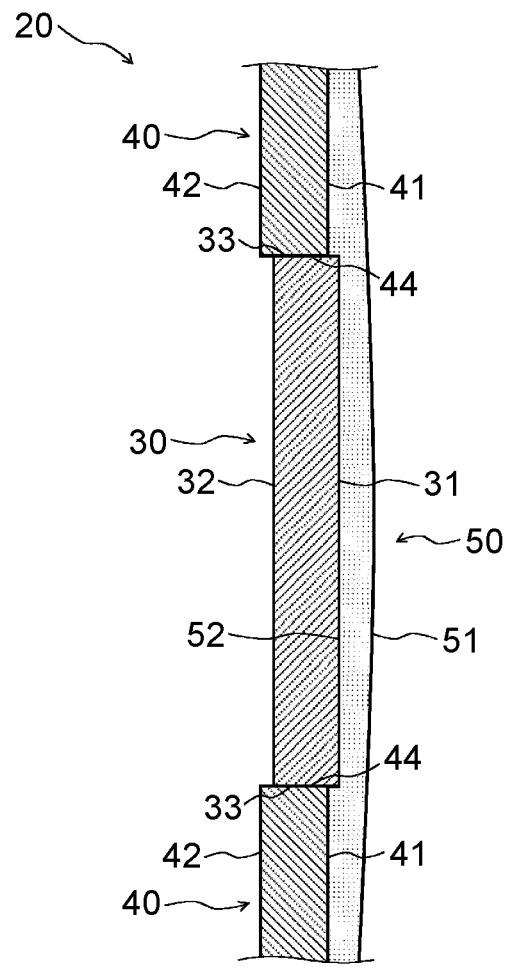
FIG. 9 is a cross-sectional view showing a modification example of the display device.

In the aforementioned embodiment, the first surface 41 of the resin member 40 is located outside the first surface 31 of the display 30. However, the present invention is not limited thereto. As shown in FIG. 9, the first surface 41 of the resin member 40 may be located inside the first surface 31 of the display 30. In addition, although not shown, the first surface 41 of the resin member 40 may be located on the same plane as the first surface 31 of the display 30.

Third Modification Example

Figure 10:
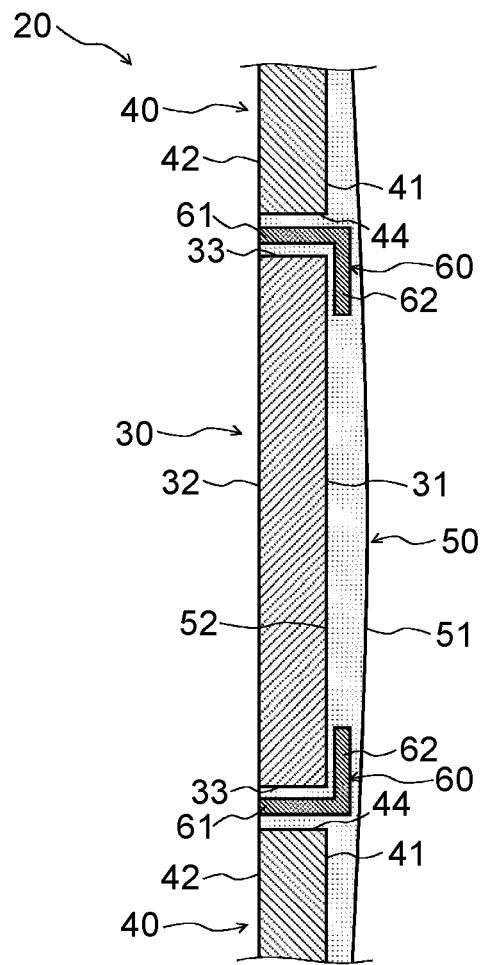
FIG. 10 is a cross-sectional view showing a modification example of the display device.

FIG. 10 is a cross-sectional view showing a modification example of the display device 20. As shown in FIG. 10, the display device 20 may comprise a frame 60 for reinforcing the display 30. The frame 60 is an L-shaped member including a first portion 61 and a second portion 62 connected to each other, for example. The first portion 61 is located between the side surface 33 of the display 30 and the inner wall surface 44 of the resin member 40. The second portion 62 is located between the first surface 31 of the display 30 and the first surface 51 of the transparent layer 50.

The frame 60 may be arranged such that there is a space between the frame 60 and the display 30. In this case, the space between the frame 60 and the display 30 may be filled with the transparent layer 50. Alternatively, the space between the frame 60 and the display 30 may be filled with a material other than the transparent layer 50. Similarly, the frame 60 may be arranged such that there is a space between the frame 60 and the resin member 40. In this case, the space between the frame 60 and the resin member 40 may be filled with the transparent layer 50. Alternatively, the space between the frame 60 and the resin member 40 may be filled with a material other than the transparent layer 50.

As long as the frame 60 can reinforce the display 30, its material, its shape, its dimensions, etc. are optional. For example, a metal material such as aluminum can be used as the material of the frame 60.

Fourth Modification Example

Figure 11:
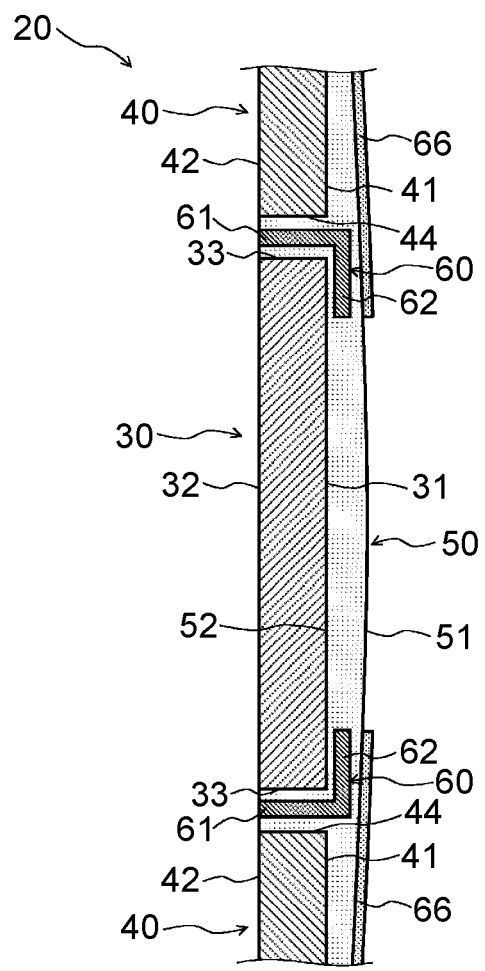
FIG. 11 is a cross-sectional view showing a modification example of the display device.

FIG. 11 is a cross-sectional view showing a modification example of the display device 20. As shown in FIG. 11, the display device 20 may comprise a decorative layer 66 located on the first surface 51 of the transparent layer 50. The decorative layer 66 contains a colored resin that exhibits a predetermined color, for example. The provision of the decorative layer 66 can improve the design of the display device 20.

The decorative layer 66 is arranged so as not to entirely cover the first surface 31 of the display 30. For example, as shown in FIG. 11, when the display device 20 comprises the frame 60, the decorative layer 66 is arranged in the thickness direction of the display device 20 to overlap a part of the first surface 31 of the display 30, which overlaps the frame 60, but not to overlap a part of the first surface 31, which does not overlap the frame 60. Thus, impairment of visibility of an image of the display 30 caused by the decorative layer 66 can be suppressed.

Fifth Modification Example

Figure 12:
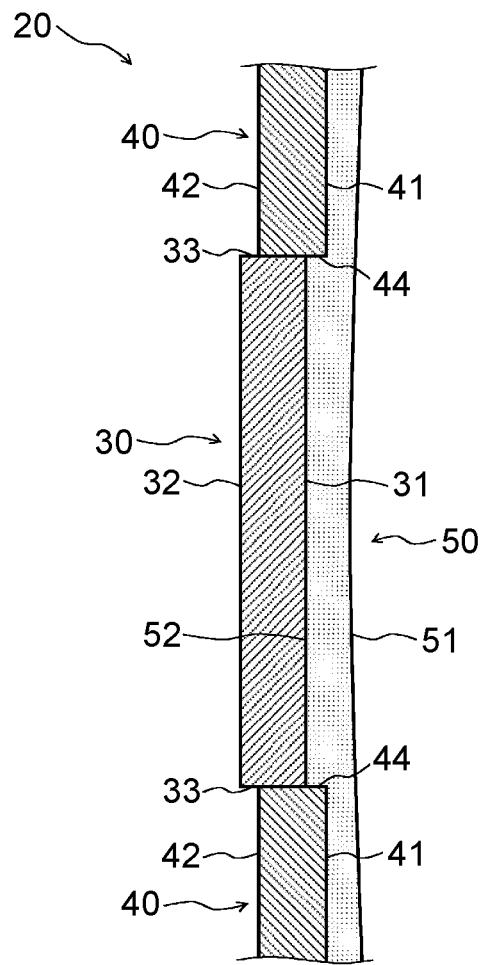
FIG. 12 is a cross-sectional view showing a modification example of the display device.

FIG. 12 is a cross-sectional view showing a modification example of the display device 20. As shown in FIG. 12, a part of the first surface 51 of the transparent layer 50, which overlaps the first surface 31 of the display 30, may have a curved shape that is concave in a direction from the first surface 51 toward the second surface 52, i.e., toward the inside.

Other Modification Examples

In the aforementioned embodiment, the resin member 40 is formed by supplying the resin 74 between the pair of first dies 71 and 72. Namely, the resin member 40 is formed on the side surface of the display 30 by an insert molding method. However, a method of forming the resin member 40 is not limited to the insert molding method, and another forming method can be employed. For example, a preformed resin member 40 may be fixed on the display 30 by using a fixing tool or the like. Also in this case, the manufacturing cost of the display device 20 can be reduced by forming the aforementioned transparent layer 50 to spread over the display 30 and the resin member 40.

In addition, in the aforementioned embodiment, the display device 20 is used in the instrument panel 10 of a motor vehicle. However, the use application of the display device 20 is not particularly limited. For example, the display device 20 may be used in the field of digital signage or housing equipment.

- 10 Instrument panel
- 11 Body part
- 12 Surface
- 13 Opening
- 20 Display device
- 30 Display
- 31 First surface
- 32 Second surface
- 33 Side surface
- 331 First side surface
- 332 Second side surface
- 40 Resin member
- 41 First surface
- 42 Second surface
- 43 Opening
- 44 Inner wall surface
- 441 First inner wall surface
- 442 Second inner wall surface
- 50 Transparent layer
- 51 First surface
- 52 Second surface
- 60 Frame
- 61 First portion
- 62 Second portion
- 66 Decorative layer
- 71 First movable die
- 72 First stationary die
- 73 First supply unit
- 74 Resin
- 76 Second movable die
- 77 Second stationary die
- 78 Second supply unit
- 79 Transparent material
- 81 First movable die plate
- 82 First stationary die plate
- 86 Second movable die plate
- 87 Second stationary die plate

The invention claimed is:

1. A display device comprising:
a display including a first surface on which an image is displayed, a second surface located oppositely to the first surface, and a side surface extending from the first surface to reach the second surface;
a resin member including an inner wall surface at least partially opposed to the side surface of the display, a first surface connected to the inner wall surface and located on the same side as the first surface of the display, and a second surface connected to the inner wall surface and located on the same side as the second surface of the display; and
a transparent layer including a second surface spreading in contact with the first surface of the display and the first surface of the resin member, and a first surface located oppositely to the second surface,
wherein the first surface of the transparent layer forms an outermost surface of the display device, and
wherein the transparent layer includes a filling portion located between the side surface of the display and the inner wall surface of the resin member.

2. The display device according to claim 1, wherein
the transparent layer contains a polyurethane or a polyurea.

3. The display device according to claim 1, wherein
the first surface and the second surface of the transparent layer are made of a same material, and
the first surface of the transparent layer includes a part overlapping the first surface of the display and having a shape different from a shape of the first surface of the display.

4. The display device according to claim 3, wherein
the first surface of the display has a flat shape, and
the part of the first surface of the transparent layer, which part overlaps the first surface of the display, has a curved shape that is convex in a direction from the second surface toward the first surface.

5. An instrument panel comprising:
a body part having a surface and an opening; and
a display device according to claim 1, located in the opening of the body part;
wherein the surface of the body part and the first surface of the transparent layer of the display device spread continuously.

6. A display device, comprising:
a display including a first surface on which an image is displayed, a second surface located oppositely to the first surface, and a side surface extending from the first surface to reach the second surface;
a resin member including an inner wall surface at least partially opposed to the side surface of the display, a first surface connected to the inner wall surface and located on the same side as the first surface of the display, and a second surface connected to the inner wall surface and located on the same side as the second surface of the display;
a transparent layer including a second surface spreading in contact with the first surface of the display and the first surface of the resin member, and a first surface located oppositely to the second surface; and
a frame including a first portion located between the side surface of the display and the inner wall surface of the resin member, and a second portion connected to the first portion and located between the first surface of the display and the first surface of the transparent layer, wherein the first surface of the transparent layer forms an outermost surface of the display device.

* * * * *